US011406194B2

(12) United States Patent
Kanazawa et al.

(10) Patent No.: US 11,406,194 B2
(45) Date of Patent: Aug. 9, 2022

(54) ELECTRONIC APPARATUS

(71) Applicant: Panasonic Intellectual Property Management Co., Ltd., Osaka (JP)

(72) Inventors: Toshihide Kanazawa, Hyogo (JP); Kaname Tomita, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 292 days.

(21) Appl. No.: 16/641,272

(22) PCT Filed: Feb. 22, 2018

(86) PCT No.: PCT/JP2018/006349
§ 371 (c)(1),
(2) Date: Feb. 24, 2020

(87) PCT Pub. No.: WO2019/043992
PCT Pub. Date: Mar. 7, 2019

(65) Prior Publication Data
US 2020/0352341 A1    Nov. 12, 2020

(30) Foreign Application Priority Data
Sep. 4, 2017    (JP) .............................. JP2017-169075

(51) Int. Cl.
*A47C 7/72*    (2006.01)
*H05K 5/02*    (2006.01)

(52) U.S. Cl.
CPC ........... *A47C 7/723* (2018.08); *H05K 5/0217* (2013.01)

(58) Field of Classification Search
CPC ........ B64D 11/00151; B64D 11/00152; B64D 11/00154; B64D 11/00155; B60R 11/0235; B60N 2/806; A47C 7/723; H05K 5/0217
(Continued)

(56) References Cited

U.S. PATENT DOCUMENTS

| 4,440,443 A * | 4/1984 | Nordskog | ............... B60N 2/882 297/217.4 |
| 5,267,775 A * | 12/1993 | Nguyen | ............... B60R 11/0235 297/217.3 |
| 7,201,356 B2 * | 4/2007 | Huang | ................... F16M 13/02 297/217.3 |

(Continued)

FOREIGN PATENT DOCUMENTS

| JP | 2004-22465 | 1/2004 | |
| JP | 2006-339081 | 12/2006 | |
| WO | WO-2014093989 A1 * | 6/2014 | ............. A45C 11/00 |

OTHER PUBLICATIONS

Extended European Search Report dated Oct. 1, 2020 in corresponding European Patent Application No. 18852358.3.
(Continued)

*Primary Examiner* — Jose V Chen
(74) *Attorney, Agent, or Firm* — Wenderoth, Lind & Ponack, L.L.P.

(57) ABSTRACT

An electronic apparatus is configured to be provided on a back surface of a seat and can be connected with an external apparatus. The electronic apparatus includes a casing, and a connector that is configured to be connected with the external apparatus. The casing includes an inclined surface that is inclined at a prescribed angle or a curved surface that is curved, toward a middle in a lateral width direction, and the connector is disposed in the inclined surface or the curved surface and connectable with the external apparatus in a
(Continued)

direction perpendicular to the inclined surface or the curved surface.

7 Claims, 8 Drawing Sheets

(58) Field of Classification Search
USPC .................. 297/217.3, 217.1, 217.4, 391
See application file for complete search history.

(56) References Cited

U.S. PATENT DOCUMENTS

| | | | |
|---|---|---|---|
| 8,113,517 B2* | 2/2012 | Canterbury | G07F 17/32 |
| | | | 463/16 |
| 8,636,570 B2* | 1/2014 | Tastad | A47C 7/727 |
| | | | 463/47 |
| 8,740,301 B2* | 6/2014 | Liu | B60N 2/879 |
| | | | 297/217.3 |
| 8,894,487 B2* | 11/2014 | Granger | G07F 17/3216 |
| | | | 463/31 |
| 9,432,716 B2* | 8/2016 | Liu | H04N 21/43615 |
| 10,556,549 B2* | 2/2020 | Chang | B60N 2/58 |
| 2008/0136230 A1* | 6/2008 | Ling | B64D 11/0638 |
| | | | 297/217.6 |
| 2009/0249408 A1* | 10/2009 | Smallhorn | B64D 11/0624 |
| | | | 725/75 |
| 2011/0174926 A1* | 7/2011 | Margis | G06F 1/18 |
| | | | 725/77 |
| 2011/0181796 A1* | 7/2011 | Caltabiano | H04N 5/645 |
| | | | 348/837 |
| 2012/0039048 A1 | 2/2012 | Mondragon et al. | |
| 2012/0139303 A1* | 6/2012 | Westerink | B64D 11/0015 |
| | | | 297/163 |
| 2014/0077539 A1* | 3/2014 | Brawner | B60R 11/0229 |
| | | | 297/217.3 |
| 2014/0198473 A1* | 7/2014 | Shah | F16M 13/02 |
| | | | 29/428 |
| 2016/0249073 A1* | 8/2016 | Margis | B64D 11/0638 |
| 2017/0290176 A1* | 10/2017 | Fujimoto | B64D 11/00151 |
| 2019/0248298 A1* | 8/2019 | Barnes | B64D 11/00151 |
| 2019/0283644 A1* | 9/2019 | Smith | B60N 3/004 |

OTHER PUBLICATIONS

International Search Report dated May 15, 2018 in International (PCT) Application No. PCT/JP2018/006349.

* cited by examiner

ELECTRONIC APPARATUS

TECHNICAL FIELD

The present disclosure relates to an electronic apparatus that is installed in a cabin of a mobile object such as an aircraft, and can be connected with an external apparatus.

BACKGROUND ART

US 2012/0039048 discloses an electronic apparatus that is installed around a seat in an aircraft cabin and can be connected with an external apparatus in a wired manner. This electronic apparatus is a module type in which an external apparatus connector is detachable, and is composed of a plurality of modules and a casing that accommodates the modules. Note that a size of each of the modules is unified. Accordingly, depending on a product, an alignment of the modules can be easily changed according to a function. Moreover, when any of the modules is broken, the module can be easily replaced. Moreover, the external apparatus connector installed around the image display device is disposed on a surface included in a downward direction from an image display.

SUMMARY OF THE INVENTION

The conventional electronic apparatus can reduce a protrusion amount of a terminal protruding to a front when an external apparatus is connected. However, the opening of the external apparatus connector is inclined in a downward direction, resulting in a decline in visibility of the external apparatus connector. Therefore, a user may have difficulty inserting a connecting terminal of the external apparatus into the opening.

The present disclosure provides an electronic apparatus that can reduce the protrusion amount of a terminal when an external apparatus is connected with a connector, while ensuring the visibility of the connector.

An electronic apparatus according to an aspect of the present disclosure is provided on a back surface of a seat, can be connected with an external apparatus, and includes a casing and a connector that is connected with the external apparatus. The casing includes an inclined surface that is inclined at a prescribed angle or a curved surface that is curved, toward a middle in a lateral width direction. The connector is disposed in the inclined surface or the curved surface and connectable with the external apparatus in a direction perpendicular to the inclined surface or the curved surface.

The electronic apparatus according to an aspect of the present disclosure can reduce the protrusion amount of a terminal when an external apparatus is connected with a connector, while ensuring the visibility of the connector.

DESCRIPTION OF EMBODIMENTS

Hereinafter, exemplary embodiments will be described in detail with reference to the drawings as appropriate. However, a detailed description more than necessary may be omitted. For example, well-known matters may not be described in detail. Further, redundant descriptions of substantially same configurations may be omitted. This is to avoid unnecessary redundancy in the following description and to facilitate understanding by those skilled in the art.

In addition, the attached drawings and the following description are provided in order to enable those skilled in the art to fully understand the present disclosure, and are not intended to limit the subject matter described in the claims.

First Exemplary Embodiment

A first exemplary embodiment will be described below with reference to FIGS. 1 to 7B.

[1-1. Configuration]

[1-1-1. Configuration of Peripheral Device]

Figure 1:
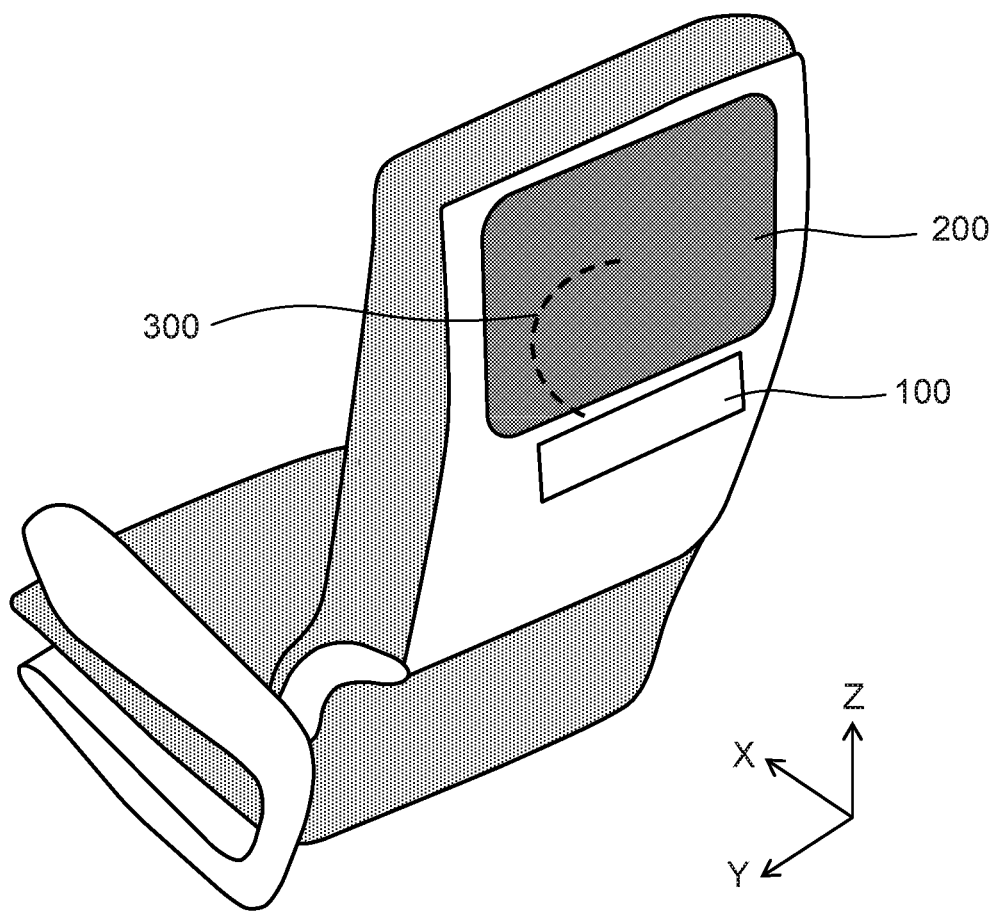
FIG. 1 is a perspective external view showing a seat mounted with an electronic apparatus according to a first exemplary embodiment.

FIG. 1 is a perspective external view showing a seat of an aircraft or the like mounted with electronic apparatus 100 according to a first exemplary embodiment.

A commercial aircraft generally includes a plurality of seats. As shown in FIG. 1, on a back surface of each of the seats, electronic apparatus 100 and image display device 200 are provided. A passenger who sits on the seat can operate electronic apparatus 100 or image display device 200 provided on the back surface of the seat in front of the passenger's seat. Note that details of electronic apparatus 100 and image display device 200 will be described later.

Electronic apparatus 100 can be connected with image display device 200 via harness 300. Harness 300 is provided inside the seat and thus invisible to the passenger.

[1-1-2. Configuration of Electronic Apparatus]

Figure 2:
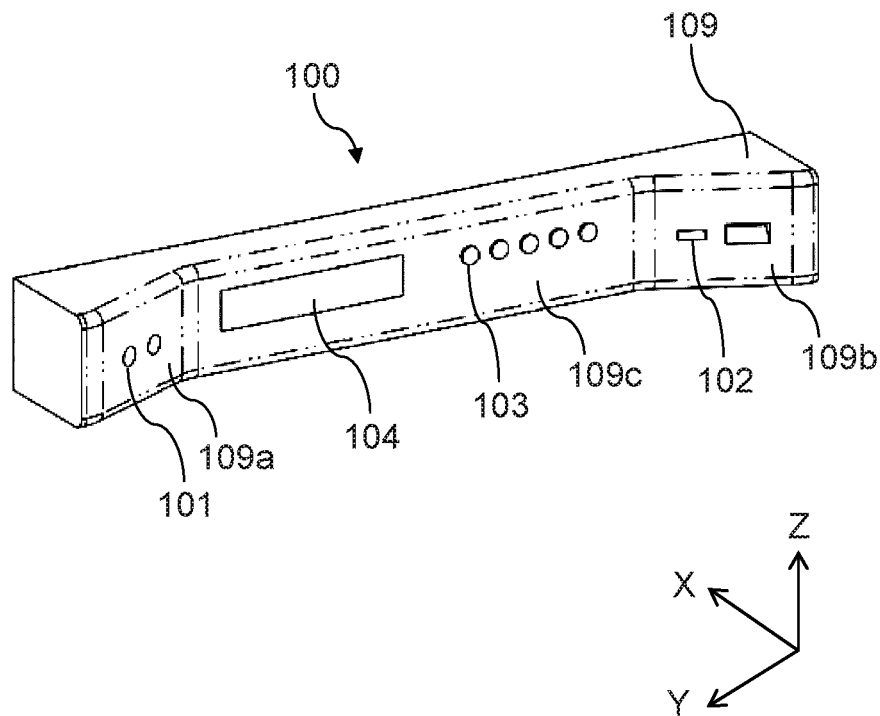
FIG. 2 is a perspective external view of the electronic apparatus according to the first exemplary embodiment.
Figure 3:
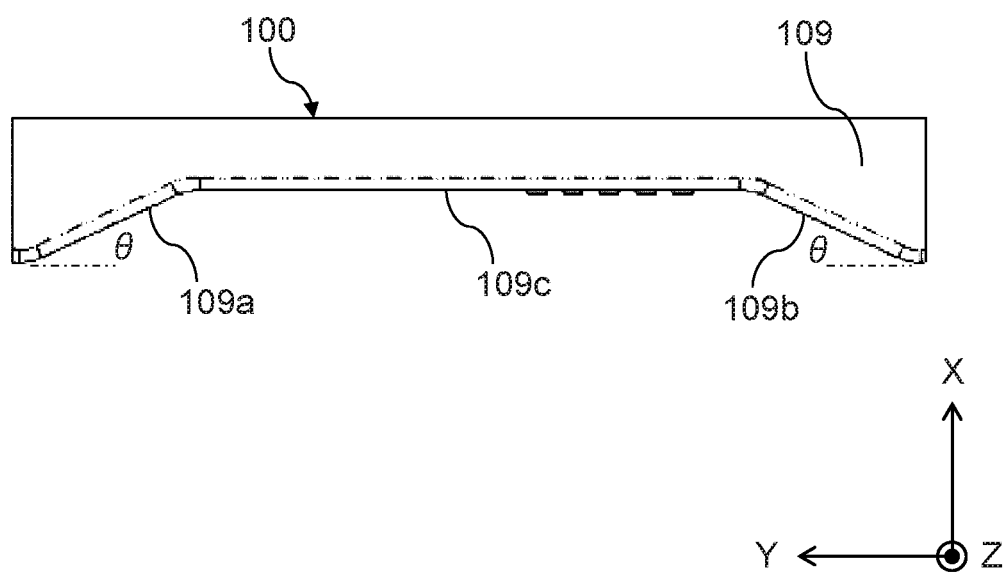
FIG. 3 is a top view of the electronic apparatus according to the first exemplary embodiment.

FIG. 2 is a perspective external view of electronic apparatus 100, and FIG. 3 is a top view of electronic apparatus 100.

Electronic apparatus 100 includes casing 109, and connectors 101 and 102 that can be connected with an external apparatus. Although not shown, the external apparatus includes, for example, a portable terminal that is carried in the aircraft by the passenger such as a smartphone or a tablet, or audio equipment such as a headset or earphones.

As shown in FIGS. 2 and 3, casing 109 includes inclined surfaces 109a, 109b that are inclined at prescribed angle θ toward a middle in a lateral width direction (Y-axis direction) of casing 109. Here, an example in which inclined surfaces 109a, 109b are formed at right and left ends of casing 109. However, inclined surfaces 109a, 109b do not have to be provided at both right and left ends, and or provided at an end. Prescribed angle θ may be any angle, for example, from 10° to 90° inclusive.

In addition to connectors 101 and 102, casing 109 includes operation units 103 and 104.

Connector 101 is, for example, an audio jack for a headset. Connector 102 is, for example, a universal series bus (USB) jack for charging and data communication of a portable terminal, or the like. Connectors 101 and 102 are provided in inclined surfaces 109a and 109b, respectively. Connector 101 is disposed in inclined surface 109a and connectable with an external apparatus (headset) in a direction perpendicular to inclined surface 109a. Connector 102 is disposed in inclined surface 109b and connectable with an external apparatus (portable terminal) in a direction perpendicular to inclined surface 109b. Connectors 101 and 102 are formed such that connecting terminals of the respective external apparatuses can be inserted or extracted in a fixed direction. The insertion or extraction direction of connector 101 is substantially perpendicular to inclined surface 109a. The insertion or extraction direction of connector 102 is substantially perpendicular to inclined surface 109b.

Operation units 103 and 104 each are, for example, an operation button that operates image display device 200 (display), and is used for instructing play, pause, fast forward, or fast rewinding. Note that operation units 103 and 104 are not limited to this operation button. Alternatively, operation units 103 and 104 each may be a button that operates a device in the cabin such as a call button for calling a cabin attendant or a button for turning on a reading light. In addition, operation unit 103 is a physical button. Operation unit 104 is an electrostatic/pressure-sensitive touch panel. As described above, a type of the operation unit is either a physical button or an electrostatic/pressure-sensitive touch panel, or both a physical button and an electrostatic/pressure-sensitive touch panel.

As shown in FIG. 2, casing 109 includes flat surface 109c that is substantially parallel to the back surface of the seat in the middle in the lateral width direction of casing 109. In the present exemplary embodiment, flat surface 109c is coupled to inclined surface 109a at a left end of flat surface 109c, and is coupled to inclined surface 109b at a right end of flat surface 109c. Operation units 103 and 104 are provided in flat surface 109c.

Figure 4:
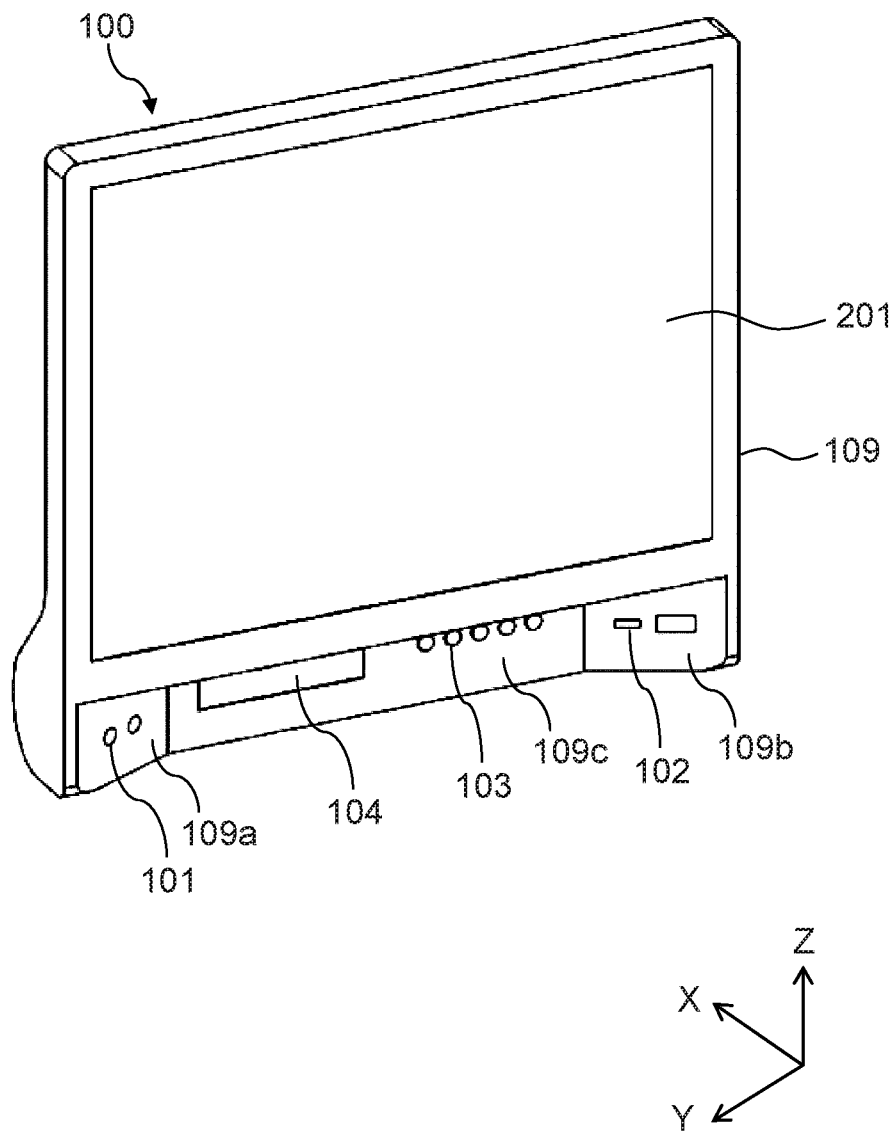
FIG. 4 is a perspective external view of the electronic apparatus including a flat image display device according to the first exemplary embodiment.
Figure 5:
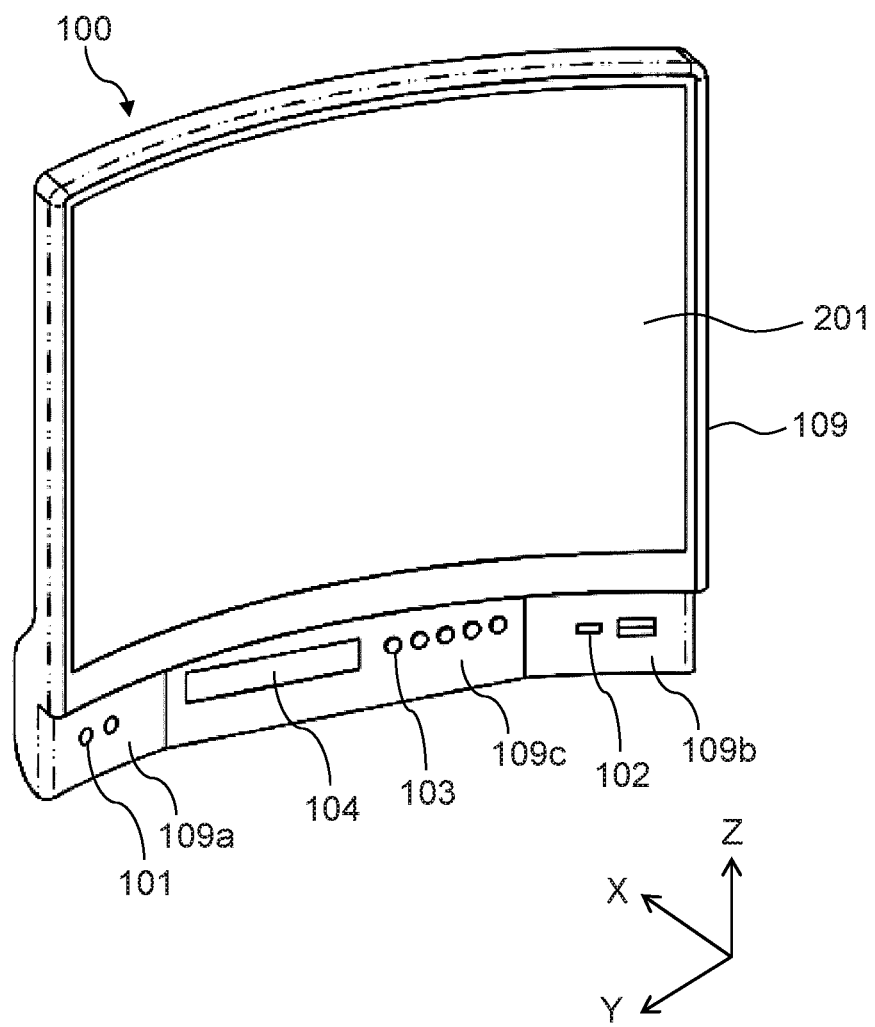
FIG. 5 is a perspective external view of the electronic apparatus including a curved image display device according to the first exemplary embodiment.

FIGS. 4 and 5 each are a perspective external view of electronic apparatus 100 including image display device 201.

In addition to connectors 101 and 102, and operation units 103 and 104, electronic apparatus 100 further includes image display device 201. Connectors 101 and 102, operation units 103 and 104, and image display device 201 are integrally formed with casing 109.

Image display device 201 outputs, for example, an image of an in-flight entertainment (a movie, a TV show, and a game image).

As shown in FIGS. 4 and 5, a display of image display device 201 is located in a further front than inclined surfaces 109a, 109b or a curved surface, in which connectors 101 and 102 are provided. In other words, inclined surfaces 109a, 109b or the curved surface, in which connectors 101 and 102 are provided, are provided in a positive X-axis direction (recessed position) from the display of image display device 201.

Note that in a case where curved image display device 201 as shown in FIG. 5 is used, connectors 101 and 102 each should have a curved surface so as to form an integrally formed shape.

[1-1-3. Internal Configuration of Electronic Apparatus]

Figure 6A:
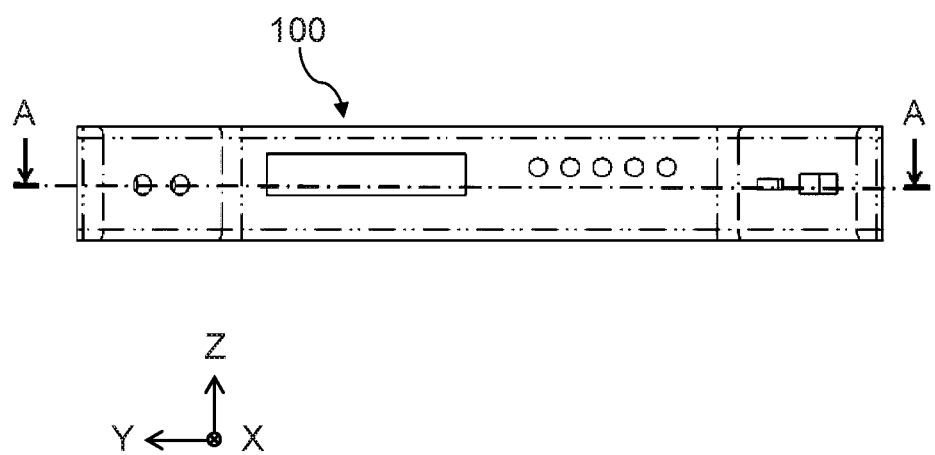
FIG. 6A is a plan view of the electronic apparatus according to the first exemplary embodiment.
Figure 6B:
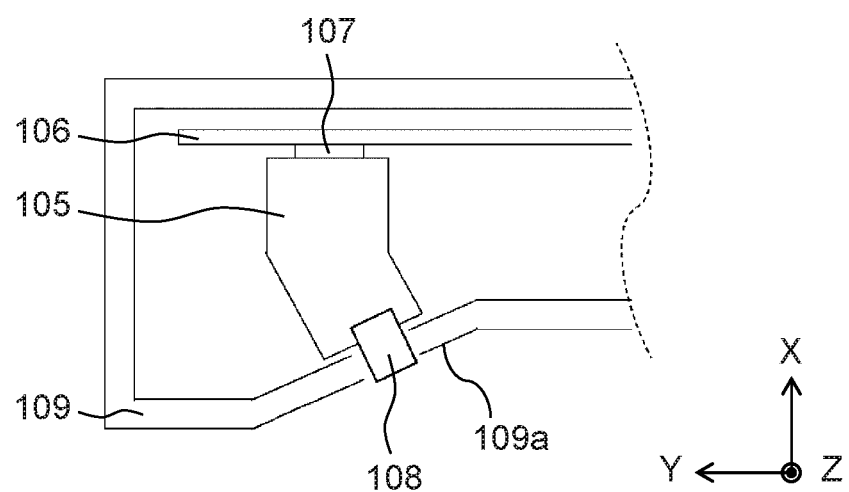
FIG. 6B is a schematic cross-sectional view of the electronic apparatus taken along line A-A of FIG. 6A.

FIG. 6A is a front view of electronic apparatus 100. FIG. 6B is a cross-sectional view of electronic apparatus 100 shown in FIG. 6A taken along line A-A. Note that FIG. 6B shows a left end portion only in a lateral width direction (Y-axis direction) of electronic apparatus 100, and a middle portion and a right end portion are not shown.

Casing 109 includes jack board 105, main board 106, board to board (BtoB) connector 107, and connecting terminal (connector) 108 inside.

In order to dispose connecting terminal 108 in inclined surface 109a that is inclined at a prescribed angle toward the middle in the lateral width direction of casing 109, jack board 105 has a shape that corresponds to the prescribed angle.

Jack board 105 is vertically connected with main board 106 using BtoB connector 107, or the like.

The direction in which a connecting terminal of an external device is inserted into or extracted from connecting terminal 108 is substantially perpendicular to inclined surface 109a.

[1-2. Effects and Others]

As described above, electronic apparatus 100 according to the present exemplary embodiment is provided on the back surface of a seat and can be connected with an external apparatus. Electronic apparatus 100 includes casing 109, and connectors 101 and 102 that are connected with the external apparatus. Casing 109 includes inclined surfaces 109a and 109b that are inclined at prescribed angle θ or a curved surface that is curved, toward the middle in a lateral width direction of casing 109. Connectors 101 and 102 are disposed in inclined surfaces 109a and 109b or the curved surface and connectable with the external apparatus in a direction perpendicular to inclined surfaces 109a and 109b or the curved surface.

As a result, when an external apparatus such as an audio terminal for a headset or a USB terminal is inserted into connectors 101 and 102, a protrusion amount of such a terminal can be reduced as compared with a case where the terminal is inserted into a same plane as the display of the image display device.

Figure 7A:
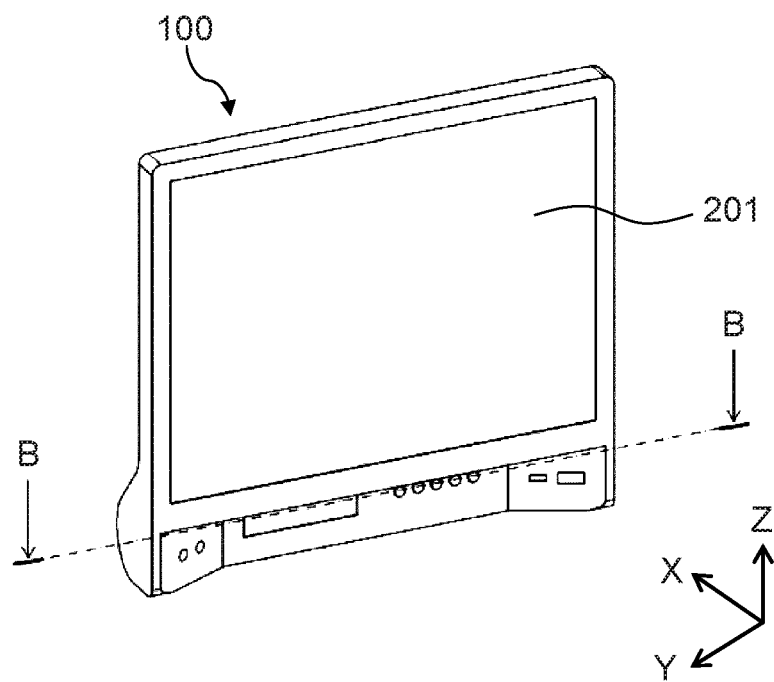
FIG. 7A is a perspective external view of the electronic apparatus including a flat image display device according to the first exemplary embodiment.
Figure 7B:
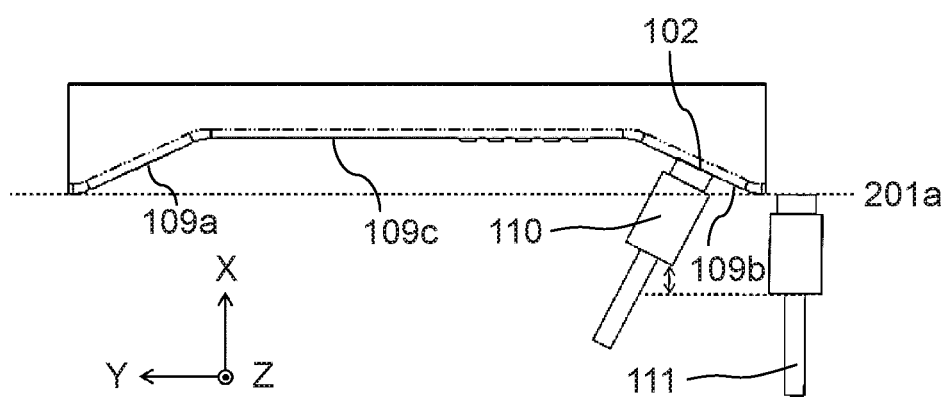
FIG. 7B is a cross-sectional view of the electronic apparatus taken along line B-B of FIG. 7A.

FIG. 7A is a perspective view of electronic apparatus 100 including image display device 201. FIG. 7B is a cross-sectional view taken along line B-B of FIG. 7A, and a schematic view when USB terminal 110 is inserted into connector 102. As described above, as compared with a case of (USB terminal 111) being inserted into same plane 201a as the display of image display device 201, the protrusion amount of USB terminal 110 in a negative X-axis direction can be reduced. As a result, when the passenger exists from the seat to a passage, a contact of the passenger with USB terminal 110 can be reduced, and thus smooth access to the seat can be achieved.

Moreover, connectors 101 and 102 are provided in inclined surfaces 109a and 109b, respectively. Inclined surfaces 109a and 109b are inclined toward a side of the passenger. As a result, the visibility of connectors 101 and 102 improves, and the terminal of the external apparatus can be easily inserted into or extracted from connectors 101 and 102.

Moreover, conventionally, a connecting surface has been provided in a surface inclined in a downward direction with respect to the display of the image display device. As a result, it has been impossible to connect a main board perpendicularly to a jack board, and thus an internal board has been complicated. In electronic apparatus 100 of the present exemplary embodiment, connectors 101 and 102 are disposed in a surface that is inclined in a horizontal direction. As a result, the internal board can be simplified.

Other Exemplary Embodiments

The first exemplary embodiment has been thus described as an example of the technique disclosed in the present application. However, the techniques of the present disclosure are not limited to the above exemplary embodiment, and can also be applied to embodiments in which change, substitution, addition, omission, and the like are performed. In addition, new exemplary embodiments can be achieved by combining the elements described in the first exemplary embodiment.

Thus, other exemplary embodiments are described as examples below.

Figure 8:
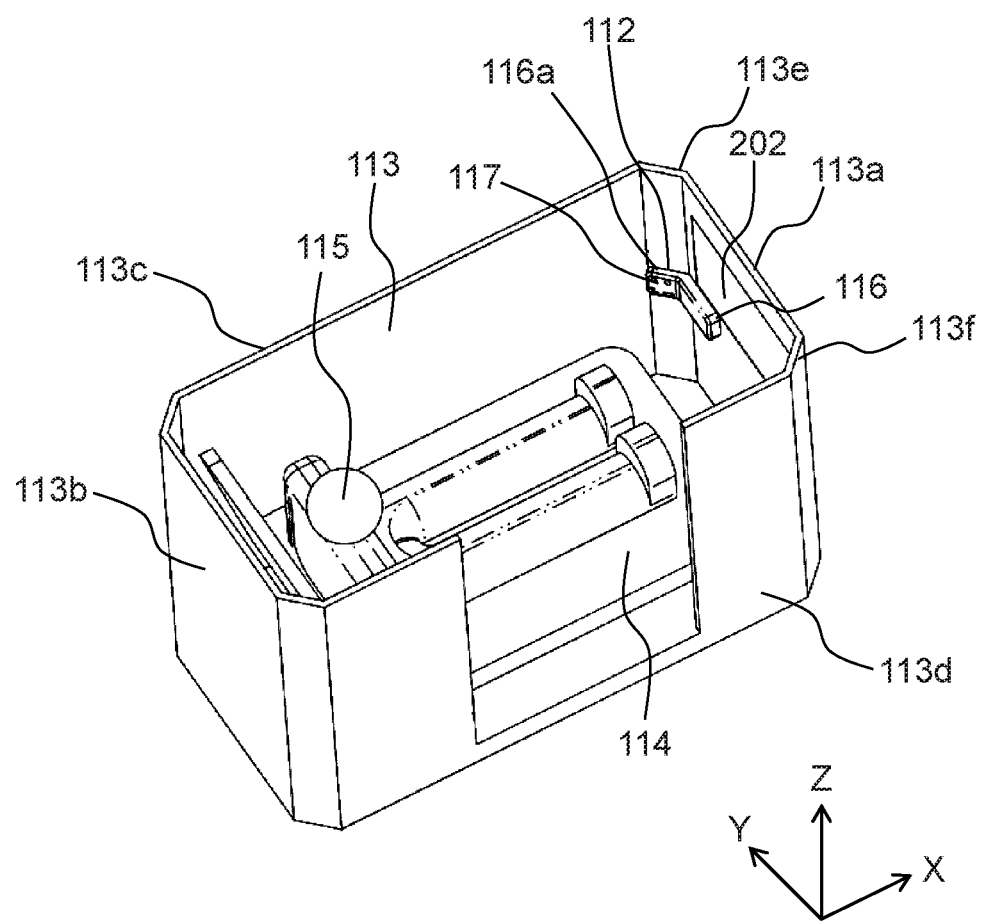
FIG. 8 is a perspective external view showing a seat shell in which the electronic apparatus according to the first exemplary embodiment is disposed.

FIG. 8 is a perspective external view showing an application in which a seat-shell type seat is mounted with electronic apparatus 112.

The seat-shell type seat is a seat including housing unit 113 that has a rectangular shape and stands on a periphery of the seat. Generally, in a commercial aircraft, although there are a few, this type of seat is mounted in a seat area of first-class, business-class, or the like. Note that housing unit 113 does not have to have a rectangular shape only, and may have a curved ellipse, or the like. Moreover, housing unit 113 does not have to stand on an entire periphery of the seat, and does not have to stand in a part of the periphery such as a portion where the passenger enters or exists from the seat.

As shown in FIG. 8, housing unit 113 has a rectangular shape, and includes front surface unit 113a, back surface unit 113b, left-side surface unit 113c, and right-side surface unit 113d. Right-side surface unit 113d has a cutout in a part thereof, through which passenger 115 can enters or exits from seat 114.

Passenger 115 who sits on seat 114 can operate electronic apparatus 112 or image display device 202 provided in housing unit 113.

Here, electronic apparatus 112 is provided on a front side of the passenger in housing unit 113. In particular, electronic apparatus 112 is provided at corner 113e that is formed of front surface unit 113a and left-side surface unit 113c. Electronic apparatus 112 includes casing 116, in which inclined surface 116a that is inclined at a prescribed angle (or a curved surface that is curved) toward seat 114, and connector 117 that is provided in inclined surface 116a (or the curved surface) and connectable with an external apparatus in a direction perpendicular to inclined surface 116a (or the curved surface).

Here, electronic apparatus 112 is provided at corner 113e formed of front surface unit 113a and left-side surface unit 113c. However, a configuration of electronic apparatus 112 is not limited thereto. Electronic apparatus 112 may be provided at least at one corner such as corner 113f formed of front surface unit 113a and right-side surface unit 113d.

Moreover, electronic apparatus 112 can be connected with image display device 202 via a harness. The harness is provided inside housing unit 113 and thus invisible to the passenger.

Figure 9:
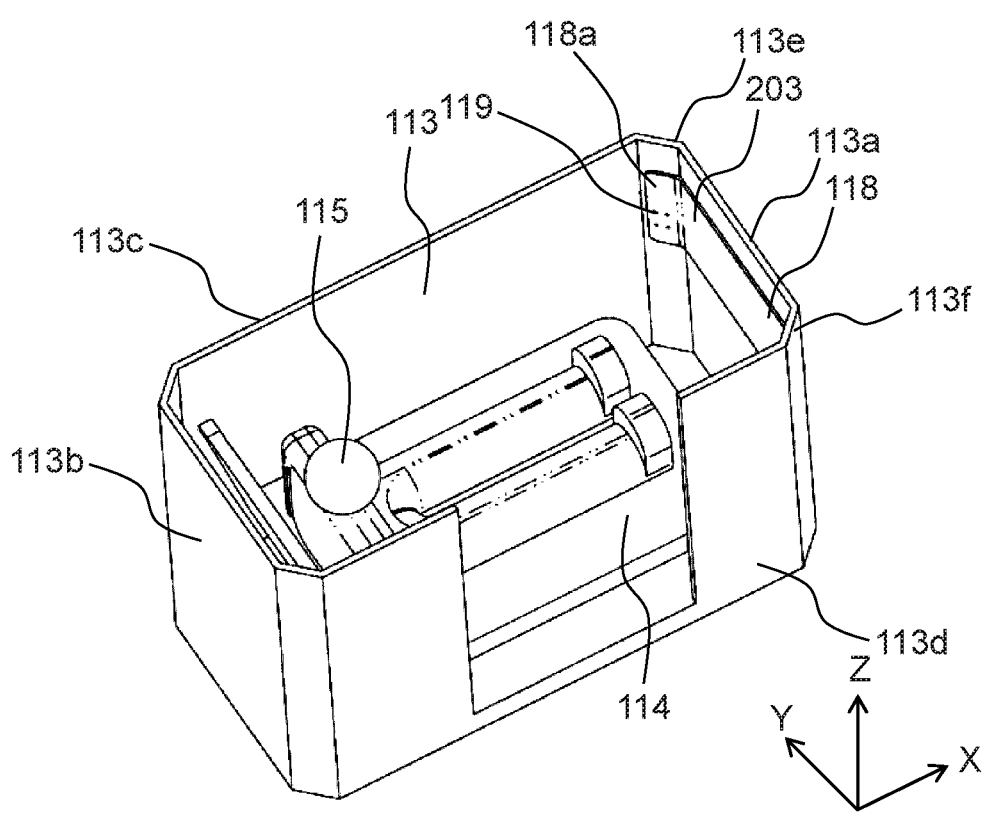
FIG. 9 is a perspective external view showing a seat shell in which the electronic apparatus including an image display device according to the first exemplary embodiment is disposed.

FIG. 9 is a perspective external view showing an application in which a seat-shell type seat is mounted with an electronic apparatus including image display device 203.

The electronic apparatus including image display device 203 is provided on a front side of the passenger in housing unit 113. In addition, the electronic apparatus including image display device 203 includes casing 118, in which inclined surface 118a that is inclined at a prescribed angle (or a curved surface that is curved) toward the seat, and connector 119 that is provided in inclined surface 118a (or the curved surface) and connectable with an external apparatus in a direction perpendicular to inclined surface 118a (or the curved surface).

In particular, inclined surface 118a is provided at corner 113e that is formed of front surface unit 113a and left-side surface unit 113c of housing unit 113. Here, connector 119 of the electronic apparatus is provided at corner 113e formed of front surface unit 113a and left-side surface unit 113c. However, a configuration of connector 119 is not limited thereto. Connector 119 may be provided at least at one corner such as corner 113f formed of front surface unit 113a and right-side surface unit 113d.

According to the applications described above, connector 117 of electronic apparatus 112 and connector 119 of the electronic apparatus including image display device 203 are provided in inclined surfaces 116a and 118a that are inclined toward the passenger side, respectively. As a result, the visibility of connectors 117 and 119 improves, and the terminal of the external apparatus can be easily inserted into or extracted from connectors 117 and 119.

Since the above-described exemplary embodiments are for exemplifying the technique of the present disclosure, various modifications, replacements, additions, and omissions can be made within the scope of the claims or their equivalents.

INDUSTRIAL APPLICABILITY

The present disclosure is applicable to an electronic apparatus that can be connected with an external apparatus. Specifically, the present disclosure is applicable to an electronic apparatus provided in a seat of a mobile object such as an aircraft, a train, or a bus.

REFERENCE MARKS IN THE DRAWINGS 100, 112: electronic apparatus
101: connector (audio jack)
102: connector (USB jack)
103: operation unit (physical button)
104: operation unit (touch panel)
105: jack board
106: main board
107: BtoB connector
108: connecting terminal (part mounted with audio jack)
109: casing
109a, 109b: inclined surface
109c: flat surface
110: USB terminal (when inserted into inclined surface)
111: USB terminal (when inserted into flat image display)
113: housing unit
113a: front surface unit
113b: back surface unit
113c: left-side surface unit
113d: right-side surface unit
113e: corner
113f: corner
114: seat
115: passenger
116: casing 117: connector
118: casing
119: connector
200, 201, 202, 203: image display device
300: harness

The invention claimed is:

1. An electronic apparatus that is configured to be provided on a back surface of a seat and can be connected with an external apparatus having a connecting terminal, the electronic apparatus comprising:
 a casing; and
 a connector that is configured to be connected with the external apparatus via the connecting terminal of the external apparatus,
 wherein:
 the casing includes an inclined surface that is inclined at a prescribed angle or a curved surface that is curved, toward a middle in a lateral width direction; and
 the connector is disposed in the inclined surface or the curved surface and configured to receive the connecting terminal of the external apparatus in a direction perpendicular to the inclined surface or the curved surface such that the connecting terminal of the external apparatus is insertable into or extractable from the connector.

2. The electronic apparatus according to claim 1, further comprising an operation unit configured to receive an operation input.

3. The electronic apparatus according to claim 2, wherein:
 the casing includes a flat surface that is configured to be parallel to the back surface of the seat in the middle in the lateral width direction of the casing; and
 the operation unit is provided in the flat surface.

4. The electronic apparatus according to claim 1, further comprising an image display device configured to display an image.

5. The electronic apparatus according to claim 4, wherein a display of the image display device is located further in front of the inclined surface or the curved surface.

6. An electronic apparatus that is configured to be included in a housing unit standing around a seat and having corners, the electronic apparatus comprising:
 a casing that is configured to be provided at any of the corners of the housing unit, and has an inclined surface that is inclined at a prescribed angle or a curved surface that is curved, the inclined surface being configured to be inclined toward the seat or the curved surface being configured to be curved toward the seat; and
 a connector that is configured to be connected with an external apparatus via a connecting terminal of the external apparatus;
 the connector is disposed in the inclined surface or the curved surface and configured to receive the connecting terminal of an external apparatus in a direction perpendicular to the inclined surface or the curved surface such that the connecting terminal of the external apparatus is insertable into or extractable from the connector.

7. The electronic apparatus according to claim 6, wherein:
 the housing unit includes a front surface unit, and a side surface unit that is coupled to the front surface unit and forms any of the corners between the side surface unit and the front surface unit, and is provided with an image display device configured to display an image; and
 the inclined surface or the curved surface is configured to be formed at any of the corners.

* * * * *